(12) United States Patent
Jeong et al.

(10) Patent No.: US 9,395,624 B2
(45) Date of Patent: Jul. 19, 2016

(54) META-PHOTORESIST FOR LITHOGRAPHY

(71) Applicant: Korea Advanced Institute of Science and Technology, Daejeon (KR)

(72) Inventors: Ki-Hun Jeong, Daejeon (KR); Youngseop Lee, Wonju-si (KR); Jae-Beom Kim, Suwon-si (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/296,186

(22) Filed: Jun. 4, 2014

(65) Prior Publication Data

US 2015/0010864 A1 Jan. 8, 2015

(30) Foreign Application Priority Data

Jul. 4, 2013 (KR) ................. 10-2013-0078563

(51) Int. Cl.
| | |
|---|---|
| G03F 7/004 | (2006.01) |
| C08K 3/08 | (2006.01) |
| H01B 1/22 | (2006.01) |
| H05K 1/09 | (2006.01) |
| G03F 7/095 | (2006.01) |
| G03F 7/11 | (2006.01) |

(52) U.S. Cl.
CPC ............. *G03F 7/0047* (2013.01); *C08K 3/08* (2013.01); *G03F 7/0043* (2013.01); *G03F 7/095* (2013.01); *G03F 7/11* (2013.01); *H01B 1/22* (2013.01); *H05K 1/095* (2013.01)

(58) Field of Classification Search
CPC ............. C08K 3/08; H01B 1/22; H05K 1/095; G03F 7/0043; G03F 7/038; G03F 7/11
USPC ................................ 430/270.1, 271.1
See application file for complete search history.

(56) References Cited

U.S. PATENT DOCUMENTS

| | | | | |
|---|---|---|---|---|
| 5,049,313 A | * | 9/1991 | Frentzel ........................ | 252/511 |
| 5,114,796 A | * | 5/1992 | Frentzel et al. ............... | 428/521 |
| 2006/0228589 A1 | * | 10/2006 | Choi et al. ................. | 428/836.3 |
| 2006/0289842 A1 | * | 12/2006 | Craig et al. ................... | 252/514 |
| 2008/0029405 A1 | * | 2/2008 | Kosowsky et al. ........... | 205/581 |
| 2012/0165334 A1 | * | 6/2012 | Boezio et al. ................. | 514/245 |
| 2014/0320833 A1 | | 10/2014 | Novak | |

FOREIGN PATENT DOCUMENTS

| | | | |
|---|---|---|---|
| JP | 08293213 A | * | 11/1996 |
| KR | 1020120132694 A | | 12/2012 |

* cited by examiner

*Primary Examiner* — Amanda C Walke
(74) *Attorney, Agent, or Firm* — The Webb Law Firm

(57) ABSTRACT

Provided are a meta-photoresist capable of transferring mask patterns on which fine patterns having a diffraction limit or less are formed, on a substrate, and a lithography method using the same, wherein the meta-photoresist contains a photosensitive resin layer and a metal particle layer which is a layer of metal particles arranged so as to be spaced apart from each other.

12 Claims, 8 Drawing Sheets

FIG. 1
(a) 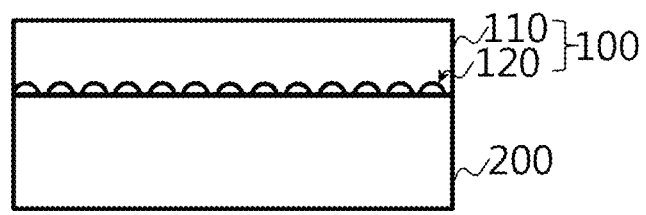
(b) 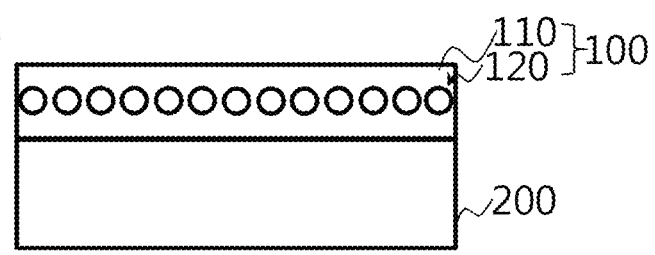
(c) 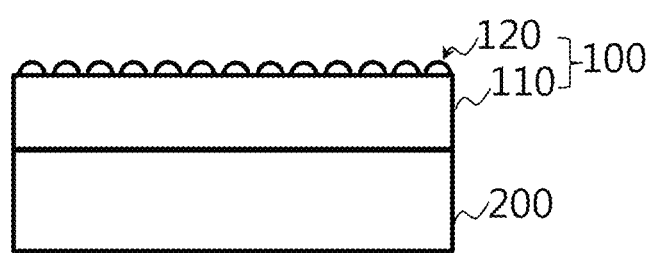

FIG. 3
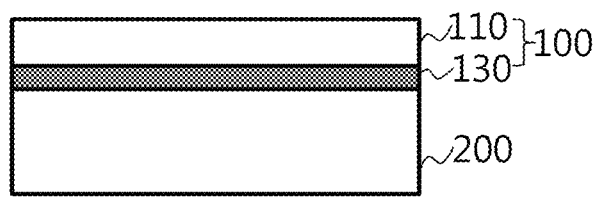
(a)
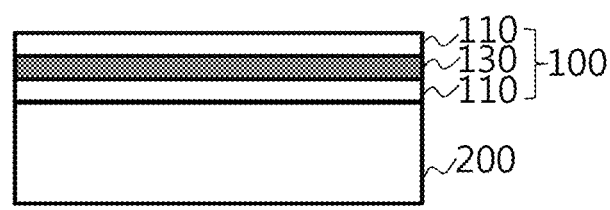
(b)
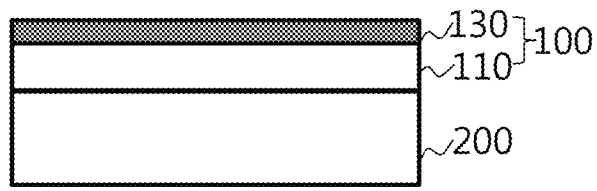
(c)

FIG. 4
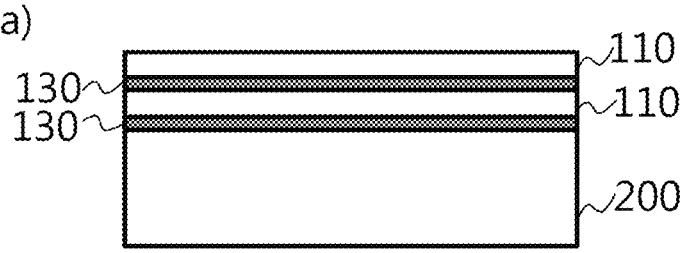
(a)
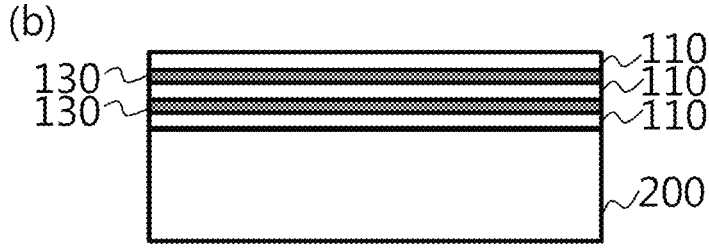
(b)
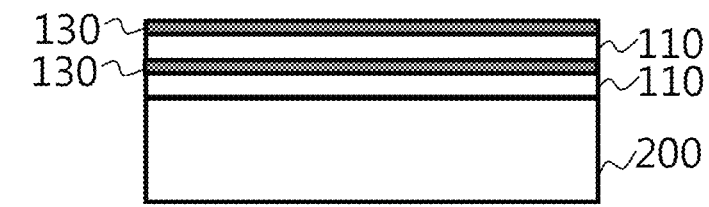
(c)

META-PHOTORESIST FOR LITHOGRAPHY

CROSS-REFERENCE TO RELATED APPLICATION

This application claims priority to Korean Patent Application No. 10-2013-0078563 filed Jul. 4, 2013, the disclosure of which is hereby incorporated in its entirety by reference.

TECHNICAL FIELD

The following disclosure relates to a meta-photoresist for lithography, and more specifically, to a meta-photoresist for implementing lithography having a diffraction limit or less.

BACKGROUND

A lithography technology is a method capable of processing fine patterns on a target substrate, and in particular, a lithography technology having a nano/micro scale is an important core technology determining development, and success and failure, of semiconductor and display industries.

A basic limitation factor in fine patterning is a wavelength of light to be used for lithography, and in a case of a circuit having a line width of 0.8 μm or more, a mercury lamp (wavelength=365 nm) was used. However, in order to pattern a line width of 0.8 μm or less, new light source was needed, such that by using KrF (Kripton Fluoride) excimer laser (wavelength=248 nm), it is possible to process a line width of 0.13 μm, and for a process of a line width of 90 nm or less, ArF (Argon Fluoride) excimer laser (wavelength=193 nm) has been used.

In order to use a wavelength shorter than that of the ArF excimer laser, a fluorine excimer laser (wavelength=157) is needed to be used; however, there are various problems in that numerical aperture of a lens system is decreased, and the like. In a case of using an extreme ultraviolet, since significantly high-priced photo mask is required, there is commercial limit, and in a case of using an electron beam, a working speed is significantly slow and the related equipment has high price, thereby having a problem in commercialization.

To this end, Korean Patent Laid-Open Publication No. 2012-0132694 suggested an immersion lithography method using a liquid phase as a delivery media of light, and the like; however, in the method, overall replacement and development of the previously established lithography equipment are inevitable, such that there is a disadvantage in that an enormous cost and a research development are required to precede.

As described above, it may be judged that a method of implementing a fine line width by a new light source reached the limit, and thus, a novel technology capable of implementing a fine line width and high degree of integration, and patterning a structure having a diffraction limit or less in a photo mask with excellent precision at a low cost, while using the previously established lithography process and equipment, is required.

RELATED ART DOCUMENT (Patent Document 1) Korean Patent Laid-Open Publication No. KR 2012-0132694

SUMMARY

An embodiment of the present invention is directed to providing a novel photoresist capable of using the previously established lithography process and equipment, and transferring patterns having a diffraction limit or less in a photo mask with excellent degree of precision, and a lithography method using the same.

In one general aspect, the present invention includes a meta-photoresist (I) for lithography including: a photosensitive resin layer; and a metal particle layer which is a layer of metal particles arranged so as to be spaced apart from each other.

The metal particle layer may be impregnated into the photosensitive resin layer.

The metal particle layer may be disposed on at least one of a lowermost surface and an uppermost surface, the lowermost surface being a surface contacting a substrate which is a target for lithography, and the uppermost surface being an opposite surface to the lowermost surface.

The meta-photoresist (I) may have a thickness of 10 nm to 500 nm.

The metal particle may have an average diameter of 5 to 150 nm.

The meta-photoresist (I) may include the metal particle layers, the number of metal particle layers being N (2≤N≤8).

In another general aspect, the present invention provides a meta-photoresist (II) for lithography including a laminate in which photosensitive resin layers and metal layers are alternately stacked.

The metal layer may have a thickness of 5 to 50 nm.

The photosensitive resin layer may have a thickness of 5 to 100 nm.

The meta-photoresist (II) may include the metal layers, the number of metal layers being N (2≤N≤8), and the photosensitive resin layer or the metal layer may be disposed on a lowermost surface, and as being independent thereto, the photosensitive resin layer or the metal layer may be disposed on an uppermost surface, the lowermost surface being a surface contacting a substrate which is a target for lithography, and the uppermost surface being an opposite surface to the lowermost surface.

In another general aspect, the present invention provides a meta-photoresist (III) for lithography including metal particles dispersed and impregnated into a photosensitive resin layer or dispersed onto a surface of the photosensitive resin layer.

The meta-photoresist (III) may contain the metal particles in 20 to 200 parts by weight, based on 100 parts by weight of the photosensitive resin in the photosensitive resin layer.

The metal particle may have an average diameter of 5 to 150 nm.

A surface of the photosensitive resin layer into which the metal particles are dispersed may be a surface region selected from a lowermost surface and an uppermost surface, the lowermost surface being a surface contacting a substrate which is a target for lithography, and the uppermost surface being an opposite surface to the lowermost surface.

The metal contained in the meta-photoresist (I, II, or III) may be silver, gold, aluminum, copper, or alloys thereof.

In another general aspect, the present invention provide a lithography method including: fabricating a meta-photoresist including a photosensitive resin layer, and a metal particle layer which is a layer of metal particles arranged so as to be spaced apart from each other, on a target substrate for lithography.

The fabricating of the meta-photoresist may include: forming a laminate by alternately stacking photosensitive resin layers and metal layers on the target substrate so that the photosensitive resin layer or the metal layer is disposed on a lowermost surface which is a surface contacting the target substrate for lithography, and as being independent thereto, the photosensitive resin layer or the metal layer is disposed on an uppermost surface which is an opposite surface to the lowermost surface; and granulating the metal layer of the laminate as metal particles arranged so as to be spaced apart from each other, by applying energy to the laminate.

The lithography method (I) may include: forming the laminate by alternately stacking the photosensitive resin layers and the metal layers on the target substrate so that the photosensitive resin layer or the metal layer is disposed on the lowermost surface which is the surface contacting the target substrate for lithography, and as being independent thereto, the photosensitive resin layer or the metal layer is disposed on the uppermost surface which is an opposite surface to the lowermost surface; b1) fabricating the meta-photoresist (I) by applying energy to the laminate to granulate the metal layer as a layer of metal particles arranged so as to be spaced apart from each other; and c1) exposing the meta-photoresist (I) by a mask, and developing the exposed meta-photoresist (I).

The lithography method (II) may include: forming the laminate by alternately stacking the photosensitive resin layers and the metal layers on the target substrate so that the photosensitive resin layer or the metal layer is disposed on the lowermost surface which is the surface contacting the target substrate for lithography, and as being independent thereto, the photosensitive resin layer or the metal layer is disposed on the uppermost surface which is an opposite surface to the lowermost surface; b2) exposing the laminate by a mask; c2) granulating the metal layer as a layer of metal particles arranged so as to be spaced apart from each other, by applying energy to the exposed laminate; and d) developing the laminate including granulated metal layers.

The lithography method (III) may include: fabricating the meta-photoresist by alternately stacking the photosensitive resin layers and the metal particle layers on the target substrate so that the photosensitive resin layer or the metal particle layer is disposed on a lowermost surface which is a surface contacting the target substrate for lithography, and as being independent of the photosensitive resin layer or the metal particle layer disposed on the lowermost surface, the photosensitive resin layer or the metal particle layer is disposed on an uppermost surface which is an opposite surface to the lowermost, the metal particle layer being formed by an oblique angle deposition, and exposing the meta-photoresist by a mask, and developing the exposed meta-photoresist.

In the lithography method (I or II), the metal layer may have a thickness of 5 to 50 nm.

In the lithography method (III), the metal particle layer may have a thickness of 5 to 150 nm.

In the lithography method (I or II), the laminate may include the metal layers, the number of metal layers being N ($2 \leq N \leq 8$).

In the lithography method (III), the laminate may include the metal particle layers, the number of metal particle layers being N ($2 \leq N \leq 8$).

In the lithography method (I or II), the energy to be applied may be at least one selected from heat energy, vibration energy, and light energy.

In the lithography method (I or II), the granulating may be performed by heat-treatment at 100 to 300.

In the lithography method (I or II), the metal contained in the laminate may be silver, gold, aluminum, copper, or alloys thereof.

In the lithography method (III), the metal contained in the metal particle layer may be silver, gold, aluminum, copper, or alloys thereof.

BRIEF DESCRIPTION OF THE DRAWINGS

FIG. 1 is one cross-sectional view showing a cross-section of a meta-photoresist (I) according to an exemplary embodiment of the present invention;

FIG. 3 is one cross-sectional view showing a cross-section of a meta-photoresist (II) according to an exemplary embodiment of the present invention;

FIG. 4 is another cross-sectional view showing a cross-section of a meta-photoresist (II) according to an exemplary embodiment of the present invention;

DETAILED DESCRIPTION OF EMBODIMENTS

Figure 2:
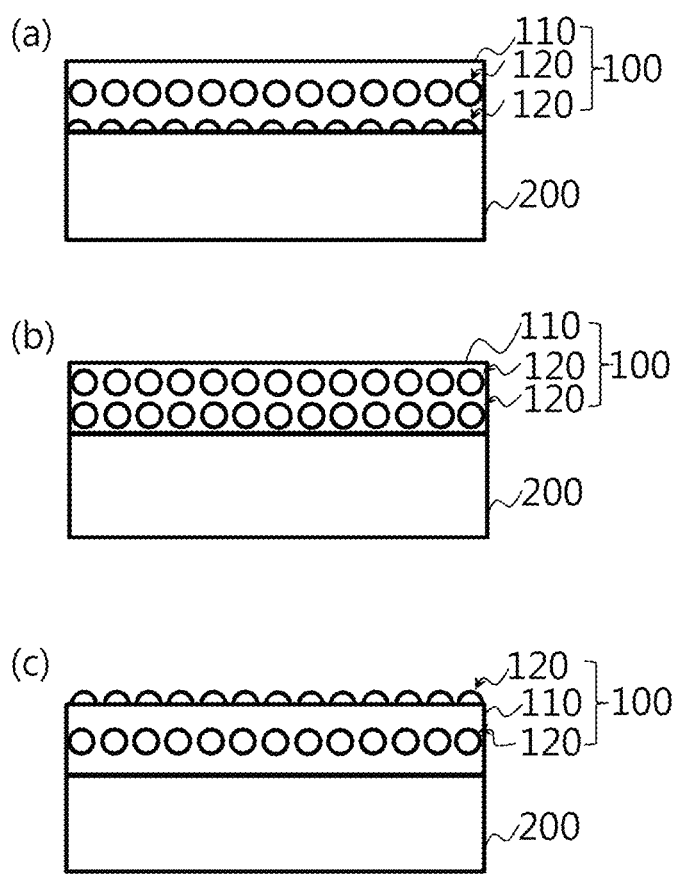
FIG. 2 is another cross-sectional view showing a cross-section of a meta-photoresist (I) according to an exemplary embodiment of the present invention.

Hereinafter, a meta-photoresist and a lithography method of the present invention will be described with reference to the accompanying drawings. The drawings to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Here, unless technical and scientific terms used herein are defined otherwise, they have meanings understood by those skilled in the art to which the present invention pertains. Known functions and components which obscure the description and the accompanying drawings of the present invention with unnecessary detail will be omitted.

A meta-photoresist (I) for lithography according to the present invention may include a photosensitive resin layer; and a metal particle layer which is a layer of metal particles arranged so as to be spaced apart from each other. The metal particle layer of the meta-photoresist (I) prevents diffraction of light to be used for exposure to implement a structure (pattern) having a diffraction limit or less of light. In the meta-photoresist (I) for lithography according to the present invention, the photosensitive resin layer may be referred to as a photosensitive resin matrix.

In detail, FIG. 1 is one cross-sectional view showing a cross-section of the meta-photoresist (I, 100) according to an exemplary embodiment of the present invention, and as shown in FIG. 1, the meta-photoresist (I) may include the photosensitive resin layer 110 and the metal particle layer 120. In the meta-photoresist (I), the metal particle layer 120 has a lower part in a direction in which the metal particle layer 120 is opposite to a substrate 200 which is a target for lithography, more specifically, a direction in which the metal particle layer 120 contacts the substrate, and a lowermost part at a side contacting the substrate 200, and as shown in FIG. 1(*a*), the metal particle layer 120 may be disposed on the lowermost surface, as shown in FIG. 1(*b*), the metal particle layer 120 may be impregnated into the photosensitive resin layer 110, and as shown in FIG. 1(*c*), the metal particle layer 120 may be disposed on the uppermost surface which is an opposite surface of the lowermost surface. Here, the uppermost surface of the meta-photoresist may be a surface opposing to a mask for exposure.

Preferably, methods and materials (for example, an etching solution) conventionally used to prevent impurities remained on a surface of the substrate after lithography and remove the photosensitive resin are capable of being used as they are, such that a change in process may be minimized, and it is preferred that the metal particle layer 120 is impregnated into the photosensitive resin layer 110 in order to hinder chemical change of the photosensitive resin at the time of exposure. However, when the photosensitive resin is coated onto one surface of the mask used for exposure, and the surface onto which the photosensitive resin of the mask is coated contacts the meta-photoresist, it does not matter that the metal particle layer 120 is disposed onto the uppermost surface of the meta-photoresist.

Metal particles constituting the metal particle layer 120 may have a shape such as a spherical shape, a cut spherical shape, and a spherical shape pressed in a thickness direction of the meta-photoresist (that is, an oval shape, or a lens shape), wherein as described below, the metal layer may be granulated by heat-treatment to be formed as the metal particle layer, such that the shape of the metal particle may not be completely spherical, and may be changed depending on heat-treatment temperature and time.

The metal particles constituting the metal particle layer 120 may be arranged so as to be spaced apart from each other on a plane, wherein the plane on which the metal particles are arranged may be a plane being vertical or being adjacent to the vertical in a thickness direction in which a direction from the uppermost surface of the meta-photoresist (I) to the lowermost surface thereof, and a case adjacent to the vertical may include cases in which an angle between the thickness direction and planes including arranged metal particles is 45° to 135°.

A size (average diameter) of metal particles constituting the metal particle layer 120 and/or a particle density which is the number of metal particles per unit area may have an effect on prevention of light diffraction and on light propagation in the meta-photoresist (I).

The metal particle may have an average diameter of 5 to 150 nm. When the metal particle has a size less than 5 nm, an effect for prevention of light diffraction in the meta-photoresist (I) is not significant, such that mask patterns having a structure with diffraction limit or less may not be transferred on a substrate, and when the metal particle has a size more than 150 nm, which is extremely large, it is difficult to uniformly propagate light, and the meta-photoresist (I) patterned by development does not have a smoothly developed cross-section (a surface penetrating through a resin), such that degree of precision of subsequent processes (for example, deposition) may be deteriorated.

In order to decrease roughness of a developed cross-section, uniformly propagate light in the meta-photoresist (I), and effectively prevent diffraction of light, the metal particle may have an average diameter of 5 to 150 nm, specifically, 5 to 100 nm, more specifically, 5 to 50 nm, and even more specifically, 5 to 10 nm.

A density of the metal particle may be a density corresponding to a range ratio occupied by the metal particles (an area occupied by metal particles/an entire area*100) of 40 to 95%, based on a cross-section in which the metal particle layer is disposed in the meta-photoresist (I). When the area ratio is less than 40%, which is extremely small, an effect for prevention of light diffraction in the meta-photoresist (I) may not be significant, and when the area ratio is more than 95%, which is extremely large, at the time of development, long time needs to be consumed or there is a risk in which a meta-photoresist (I) region to be removed remains.

In order to clearly remove a region in which chemical properties are changed by exposure in a short time and effectively prevent light diffraction, the metal particle may have a density corresponding to the area ratio occupied by the metal particles of 40 to 95%, specifically, 40 to 80%, more specifically, 40 to 70%.

FIG. 2 is another cross-sectional view showing a cross-section of a meta-photoresist (I) according to an exemplary embodiment of the present invention, FIG. 2(*a*) shows a structure in which two or more metal particle layers 120 are impregnated into the photosensitive resin layer 110 while the metal particles are spaced apart from each other, FIG. 2(*b*) shows a structure in which one of two or more metal particle layers 120 is disposed on the lowermost surface and the remaining metal particle layers 120 are impregnated into the photosensitive resin layer 110, FIG. 2(*c*) shows a structure in which one of two or more metal particle layers 120 is disposed on the uppermost surface and the remaining metal particle layers 120 are impregnated into the photosensitive resin layer 110. As shown in FIG. 2, the meta-photoresist (I) may include the metal particle layers, the number of metal particle layers being N ($2 \leq N \leq 8$). The number of metal particle layers included in the meta-photoresist (I) may be adjusted by considering a kind and a structure of a target material (element, device) to be formed by lithography and by considering wavelength and energy of light to be used for exposure. However, in order to prevent light diffraction, as described above based on FIG. 1, it is preferred to provide at least one metal particle layer and provide 8 or less metal particle layers so that light is effectively delivered up to the lowermost surface of the meta-photoresist (I).

When the meta-photoresist (I) includes two or more metal particle layers, the metal particle layers may be arranged so as to be spaced apart from each other in a thickness direction, the thickness direction being a direction from the uppermost surface to the lowermost surface.

A distance spaced between the metal particle layers may be each independently 5 to 100 nm, for each metal particle layers adjacent to each other, wherein when the distance spaced between the metal particle layers is less than 5 nm, an increase in an effect for prevention of light diffraction is not significant; meanwhile, fraction occupied by the photosensitive resin layer capable of fabricating a structure substantially patterned in the meta-photoresist (I) by exposure and development is extremely decreased, such that it is difficult to implement a precise and fine structure. When the distance spaced between the metal particle layers is more than 100 nm, diffraction of light may not be prevented by the metal particle layers. The distance spaced between the metal particle layers may be a distance obtained by subtracting an average diameter of the metal particles from a distance between virtual surfaces in which the centers of the metal particles constituting the metal particle layers are connected to each other, based on two metal particle layers adjacent to each other.

In addition, in the structure in which all of the metal particle layers are impregnated into the metal resin layer, a distance between the uppermost surface (or the lowermost surface) of the meta-photoresist (I) and the metal particle layer which is the most adjacent to the uppermost surface (or the lowermost surface) may be 5 to 100 nm, which is similar to the distance spaced between the metal particle layers.

A thickness of the meta-photoresist (I) according to an exemplary embodiment of the present invention may be appropriately adjusted by considering the number of metal particle layers included in the meta-photoresist (I); however, when the number of metal particle layers is 1 to N (a natural number satisfying 2≤N≤8), the meta-photoresist (I) may have a thickness of 10 nm to 500 nm.

The thickness of the meta-photoresist (I) may be appropriately adjusted by considering energy of light to be irradiated at the time of exposure. However, when the thickness of the meta-photoresist (I) is less than 10 nm, which is extremely thin, the meta-photoresist which is patterned on a target substrate for lithography and remained after exposure and development onto the meta-photoresist, has extremely thin thickness, such that at the time of subsequent processes such as injection of impurities into the target substrate, etching of the target substrate, and deposition of a material on the target substrate, the meta-photoresist may not effectively perform a mask role. In addition, when the thickness of the meta-photoresist is more than 500 nm, which is extremely thick, the mask role of the subsequent process may be effectively performed, however, a surface step which is extremely large by the meta-photoresist is formed on the substrate, such that the subsequent processes may not be uniformly and homogeneously performed in a desired region, and it is difficult to have uniform chemical change of the photosensitive resin depending on a thickness at the time of exposure, thereby causing defect problems to be increased at the time of exposure process, and thus, at the time of development, the developed cross-section of the meta-photoresist has deteriorated quality.

The meta-photoresist (I) may have a thickness of 10 nm to 500 nm, specifically, 15 to 300 nm, and more specifically, 25 to 200 nm, so that a mask role may be effectively performed without deterioration of the quality of the subsequent process, and development patterns on which patterns formed in the mask are precisely transferred, and developed cross-section having a flat surface shape and high quality may be fabricated.

Metals contained in the meta-photoresist (I) according to an exemplary embodiment of the present invention, that is, metal particles of the metal particle layer, may be silver, gold, aluminum, copper, or alloys thereof. The metal enables the metal layer to be granulated by significantly low heat-treatment temperature not having an effect on the photosensitive resin or the substrate at the time of using a lithography method to be described below, and at the time of granulating the metal layers, the metal particles having uniform size may be homogeneously formed even when the meta-photoresist has a large area.

A meta-photoresist (II, 100) for lithography according to the present invention includes a laminate in which the photosensitive resin layers and the metal layers are alternately stacked. The metal layer of the meta-photoresist (II) prevents diffraction of light to be used for exposure to implement a structure (pattern) having a diffraction limit or less of light.

In detail, FIG. 3 is one cross-sectional view showing a cross-section of the meta-photoresist (II) according to an exemplary embodiment of the present invention, and as shown in FIG. 3, the meta-photoresist (II) may include the photosensitive resin layer 110 and the metal layer 130. In the meta-photoresist (II), the metal layer 130 has a lower part in a direction in which the metal layer 130 is opposite to a substrate 200 which is a target for lithography, more specifically, a direction in which the metal layer 130 contacts the substrate, and a lowermost part at a side opposing to the substrate 200, that is, a side contacting the substrate 200, and as shown in FIG. 3(a), the metal layer 130 may be disposed on the lowermost surface, as shown in FIG. 3(b), the metal layer 130 may be disposed between the photosensitive resin layers 110, and as shown in FIG. 3(c), the metal layer 130 may be disposed on the uppermost surface which is an opposite surface of the lowermost surface. Here, methods and materials (for example, an etching solution) conventionally used to prevent impurities remained on a surface of the substrate after lithography and remove the photosensitive resin are capable of being used as they are, such that a change in process may be minimized, and it is preferred that the metal layer 130 is stacked between the photosensitive resin layers 110 in order to hinder chemical change of the photosensitive resin at the time of exposure. However, when the photosensitive resin is coated onto one surface of the mask used for exposure, and the surface onto which the photosensitive resin of the mask is coated contacts the meta-photoresist, it does not matter that the metal layer 130 is disposed onto the uppermost surface of the meta-photoresist.

A thickness of the metal layer 130 may have an effect on prevention of light diffraction and on light propagation in the meta-photoresist (II), and may be 5 to 50 nm. When the metal layer 130 has a thickness less than 5 nm, which is extremely thin, an effect for prevention of light diffraction in the meta-photoresist (II) is not significant, such that mask patterns having a structure with diffraction limit or less may not be transferred on a substrate, and when the metal layer 130 has a thickness more than 50 nm, which is extremely thick, propagation of light may be hindered, and when using a lithography method to be described below, granulating of the metal layers by heat-treatment may not be uniformly and easily performed.

FIG. 4 is another cross-sectional view showing a cross-section of a meta-photoresist (II) according to an exemplary embodiment of the present invention, FIG. 4(a) shows a structure in which two or more metal layers 130 and photosensitive resin layers 110 are alternately stacked so that the photosensitive resin layers are disposed on upper and lower parts of the metal layers 130, FIG. 4(b) shows a structure in which two or more metal layers 130 and photosensitive resin layers 110 are alternately stacked so that one metal layer 130 of two or more metal layers 130 is disposed on the lowermost part and the other metal layers 130 are disposed between the photosensitive resin layers 110, and FIG. 4(c) shows a structure in which two or more metal layers 130 and photosensitive resin layers 110 are alternately stacked so that one metal layer 130 of two or more metal layers 130 is disposed on the uppermost part and the other metal layers 130 are disposed between the photosensitive resin layers 110. As shown in FIG. 4, the meta-photoresist (II) may include the metal layers, the number of metal layers being N (2≤N≤8). The number of metal layers included in the meta-photoresist (II) may be adjusted by considering a kind and a structure of a target material (element, device) to be formed by lithography and by considering wavelength and energy of light to be used for exposure. However, in order to prevent light diffraction, as described above based on FIG. 3, it is preferred to provide at least one metal layer and provide 8 or less metal layers so that light is effectively delivered up to the lowermost surface of the meta-photoresist (III).

When the meta-photoresist (II) includes two or more metal layers, the metal layers may be arranged so as to be spaced apart from each other in a thickness direction, the thickness direction being a direction from the uppermost surface to the lowermost surface. Here, the distance spaced between the metal layers may correspond to a thickness of the photosensitive resin layer, and the distance spaced between the metal layers (the thickness of the photosensitive resin layer) may be 5 to 100 nm. When the distance spaced between the metal layers is less than 5 nm, an increase in an effect for prevention of diffraction is not significant; meanwhile, fraction occupied by the photosensitive resin layer capable of fabricating a structure substantially patterned in the meta-photoresist (II) by exposure and development is extremely decreased, such that it is difficult to implement a precise and fine structure. When the distance spaced between the metal layers is more than 100 nm, diffraction of light may not be prevented by the metal layers.

A thickness of the meta-photoresist (II) according to an exemplary embodiment of the present invention may be appropriately adjusted by considering the number of metal particle layers included in the meta-photoresist (II); however, when the number of metal particle layers is 1 to N ($2 \leq N \leq 8$), the meta-photoresist (II) may have a thickness of 10 nm to 500 nm.

Similar to the description above in the meta-photoresist (I), when the thickness of the meta-photoresist (II) is less than 10 nm, which is extremely thin, the meta-photoresist which is patterned on a target substrate for lithography and remained after exposure and development onto the meta-photoresist, has extremely thin thickness, such that at the time of subsequent processes such as injection of impurities into the target substrate, etching of the target substrate, and deposition of a material on the target substrate, the meta-photoresist may not effectively perform a mask role. In addition, when the thickness of the meta-photoresist is more than 500 nm, which is extremely thick, the mask role of the subsequent process may be effectively performed, however, a surface step which is extremely large by the meta-photoresist is formed on the substrate, such that the subsequent processes may not be uniformly and homogeneously performed in a desired region, and it is difficult to have uniform chemical change of the photosensitive resin depending on a thickness at the time of exposure, thereby causing defect problems to be increased at the time of exposure process, and thus, at the time of development, the developed cross-section of the meta-photoresist has deteriorated quality.

The meta-photoresist (II) may have a thickness of 10 nm to 500 nm, specifically, 15 to 300 nm, and more specifically, 25 to 200 nm, so that a mask role may be effectively performed without deterioration of the quality of the subsequent process, and development patterns on which patterns formed in the mask are precisely transferred, and developed cross-section having a flat surface shape and high quality may be fabricated.

A metal contained in the meta-photoresist (II) according to an exemplary embodiment of the present invention, that is, a metal of the metal layer, may be silver, gold, aluminum, copper, or alloys thereof. The metal enables the metal layer to be granulated by significantly low heat-treatment temperature not having an effect on the photosensitive resin or the substrate at the time of using a lithography method to be described below.

The meta-photoresist (II) may contain the metal particles in 20 to 200 parts by weight, based on 100 parts by weight of the photosensitive resin in the photosensitive resin layer.

A meta-photoresist according to an exemplary embodiment of the present invention may contain metal particles dispersed and impregnated into the photosensitive resin layer or dispersed onto a surface of the photosensitive resin layer. The metal particles dispersed into the photosensitive resin layer prevents diffraction of light to be used for exposure to implement a structure (pattern) having a diffraction limit or less of light. In the meta-photoresist (III) according to an exemplary embodiment of the present invention, the photosensitive resin layer may be referred to as a photosensitive resin matrix.

When metal particles are dispersed onto a surface of the photosensitive resin layer, the surface of the photosensitive resin layer may be a surface region selected from a lowermost surface and an uppermost surface, the lowermost surface being a surface contacting a substrate which is a target for lithography, and the uppermost surface being an opposite surface to the lowermost surface. In detail, the metal particles may be dispersed onto an overall surface or a partial surface region of the uppermost surface and/or the lowermost surface.

In the meta-photoresist (III) according to an exemplary embodiment of the present invention, the meta-photoresist (III) may contain the metal particles in 20 to 200 parts by weight, based on 100 parts by weight of the photosensitive resin in the photosensitive resin layer. When the metal particles less than 20 parts by weight based on 100 parts by weight of the photosensitive resin are dispersed, an effect for prevention of light diffraction by the metal particles may not be significant, and when the metal particles more than 200 parts by weight based on 100 parts by weight of the photosensitive resin are dispersed, an increase in an effect for prevention of light diffraction is not significant; meanwhile, there is a risk that light may not be smoothly delivered in the meta-photoresist (III), exposure may not be uniformly and homogeneously performed in a thickness direction of the meta-photoresist, and at the time of development, the developed cross-section has deteriorated quality due to the metal particles.

In order to effectively prevent light diffraction and secure homogeneous and uniform quality of the exposed and developed cross-section in the meta-photoresist, the meta-photoresist (III) may contain metal particles in 20 to 200 parts by weight, specifically, 50 to 150 parts by weight, and more specifically, 70 to 150 parts by weight, based on 100 parts by weight of the photosensitive resin in the photosensitive resin layer.

In the meta-photoresist (III) according to an exemplary embodiment of the present invention, the metal particles dispersed into the photosensitive resin layer may have an average diameter of 5 to 150 nm. When the metal particle has a size less than 5 nm, an effect for prevention of light diffraction in the meta-photoresist (III) is not significant, such that there is a risk that mask patterns having a structure with diffraction limit or less may not be transferred on a substrate, and when the metal particle has a size more than 150 nm, which is extremely large, it is difficult to uniformly propagate light, and the meta-photoresist (III) patterned by development does not have a smoothly developed cross-section (a surface penetrating through a resin), such that there is a risk that degree of precision of subsequent processes (for example, deposition) may be deteriorated.

In order to decrease roughness of a developed cross-section, uniformly propagate light in the meta-photoresist (III), and effectively prevent diffraction of light, the metal particle may have an average diameter of 5 to 150 nm, specifically, 5 to 100 nm, more specifically, 5 to 50 nm, and further more specifically, 5 to 10 nm.

In the meta-photoresist (III) according to an exemplary embodiment of the present invention, the meta-photoresist (III) may have a structure in which two or more photosensitive resin layers having at least one different factor selected from a content of the metal particles dispersed into the photosensitive resin layer and a size of the metal particles dispersed thereinto are stacked. In detail, 2 to 8 photosensitive resin layers having different content and/or different size of the metal particles may be stacked.

In the meta-photoresist (III) according to an exemplary embodiment of the present invention, the meta-photoresist (III) may have a thickness of 10 to 500 nm. Similar to the description above in the meta-photoresist (I or II), when the thickness of the meta-photoresist (III) is less than 10 nm, which is extremely thin, the meta-photoresist which is patterned on a target substrate for lithography and remained after exposure and development onto the meta-photoresist, has extremely thin thickness, such that at the time of subsequent processes such as injection of impurities into the target substrate, etching of the target substrate, and deposition of a material on the target substrate, there is a risk that the meta-photoresist may not effectively perform a mask role. In addition, when the thickness of the meta-photoresist is more than 500 nm, which is extremely thick, the mask role of the subsequent process may be effectively performed, however, a surface step which is extremely large by the meta-photoresist is formed on the substrate, such that there is a risk that the subsequent processes may not be uniformly and homogeneously performed in a desired region, and it is difficult to have uniform chemical change of the photosensitive resin depending on a thickness at the time of exposure, thereby causing defect problems to be increased at the time of exposure process, and thus, there is a risk that at the time of development, the developed cross-section of the meta-photoresist has deteriorated quality.

The meta-photoresist (II) may have a thickness of 10 nm to 500 nm, specifically, 15 to 300 nm, and more specifically, 25 to 200 nm, so that a mask role may be effectively performed without deterioration of the quality of the subsequent process, and development patterns on which patterns formed in the mask are precisely transferred, and developed cross-section having a flat surface shape and high quality may be fabricated.

In the meta-photoresist (I, II, or III) according to an exemplary embodiment of the present invention, the photosensitive resin of the photosensitive resin layer may be any polymer material of which resistance to solvent is changed by light used in general lithography process, and may include a negative type photosensitive resin which is non-soluble in solvent by being exposed to light or a positive type photosensitive resin which is soluble in solvent by being exposed to light. Here, the photosensitive resin layer may have various multilayer structures developed in order to implement fine patterns and effectively perform the subsequent injection of impurities, etching or deposition process in general lithography process. As an example of the multilayer structure, the photosensitive resin layer may have a multilayer structure in which resin layers having photosensitive properties and etching resistant layers for securing etching resistance are stacked, however, the present invention is not limited by materials of the photosensitive resin and a specific structure of the photosensitive resin layer.

The meta-photoresist (I, II, or III) according to an exemplary embodiment of the present invention may be a meta-photoresist for lithography, and more specifically, for nano-lithography. The mask may be formed with mask patterns having a size (pitch) with half-wave or less of light used for exposure, and the meta-photoresist may be a photoresist for lithography performed by the mask. Light used for exposure may be a light in extreme ultraviolet to ultraviolet region, and specifically, having a wavelength of 100 nm to 400 nm.

The present invention includes a lithography method using the above-described meta-photoresist (I), a lithography method using the above-described meta-photoresist (II), and a lithography method using the above-described meta-photoresist (III).

The lithography method according to the present invention may include fabricating a meta-photoresist including a photosensitive resin layer, and a metal particle layer which is a layer of metal particles arranged so as to be spaced apart from each other, on a target substrate for lithography (hereinafter, referred to as a target substrate).

In detail, the lithography method according to an exemplary embodiment of the present invention may include fabricating a meta-photoresist including a photosensitive resin layer, and a metal particle layer which is a layer of metal particles arranged so as to be spaced apart from each other, on a target substrate for lithography (hereinafter, referred to as target substrate), and the exposure using the mask may be performed during the fabricating of the meta-photoresist or after the fabricating of the meta-photoresist, and after the meta-photoresist is fabricated and the exposure is performed, the development process may be performed.

In the lithography method according to an exemplary embodiment of the present invention, the fabricating of the meta-photoresist may include forming a laminate by alternately stacking photosensitive resin layers and metal layers on the target substrate so that the photosensitive resin layer or the metal layer is disposed on a lowermost surface which is a surface contacting the target substrate for lithography, and as being independent of the photosensitive resin layer or the metal layer disposed on the lowermost surface, the photosensitive resin layer or the metal layer is disposed on an uppermost surface which is an opposite surface to the lowermost surface; and granulating the metal layer of the laminate as metal particles arranged so as to be spaced apart from each other, by applying energy to the laminate. Here, after the forming of the laminate or before the granulating, the exposure using the mask may be performed (lithography method (I)), and as being independent of the lithography method (I), after both of the forming of the laminate and the granulating are performed, the exposure using the mask may be performed (lithography method (II)).

In the fabricating of the meta-photoresist, energy for granulating may not be applied, and thus, more specifically, the lithography method according to an exemplary embodiment of the present invention may include fabricating the meta-photoresist by alternately stacking the photosensitive resin layers and the metal layers on the target substrate so that the photosensitive resin layer or the metal particle layer is disposed on a lowermost surface which is a surface contacting the target substrate for lithography, and as being independent of the photosensitive resin layer or the metal particle layer disposed on the lowermost surface, the photosensitive resin layer or the metal particle layer is disposed on an uppermost surface which is an opposite surface to the lowermost, the metal particle layer being formed by an oblique angle deposition; and exposing the meta-photoresist by a mask, and developing the exposed meta-photoresist.

As described above, when the granulating is performed by applying energy, the lithography method (I or II) according to the present invention may be divided into two methods depending on time at which the granulating of the metal layer is performed. The lithography method (I) is a case in which the granulating of the metal layer is performed before exposure, and the lithography method (II) is a case in which the granulating of the metal layer is performed after exposure.

The lithography method (I) according to an exemplary embodiment of the present invention may include a) forming the laminate by alternately stacking the photosensitive resin layers and the metal layers on the target substrate so that the photosensitive resin layer or the metal layer is disposed on the lowermost surface which is the surface contacting the target substrate for lithography, and as being independent of the photosensitive resin layer or the metal layer disposed on the lowermost surface, the photosensitive resin layer or the metal layer is disposed on the uppermost surface which is an opposite surface to the lowermost surface; b1) fabricating the meta-photoresist (I) by applying energy to the laminate to granulate the metal layer as a layer of metal particles arranged so as to be spaced apart from each other; and c1) exposing the meta-photoresist (I) by a mask, and developing the exposed metal-photoresist.

The lithography method (II) according to an exemplary embodiment of the present invention may include a) forming the laminate by alternately stacking the photosensitive resin layers and the metal layers on the target substrate so that the photosensitive resin layer or the metal layer is disposed on the lowermost surface which is the surface contacting the target substrate for lithography, and as being independent of the photosensitive resin layer or the metal layer disposed on the lowermost surface, the photosensitive resin layer or the metal layer is disposed on the uppermost surface which is an opposite surface to the lowermost surface; b2) exposing the laminate by a mask; c2) granulating the metal layer as a layer of metal particles arranged so as to be spaced apart from each other, by applying energy to the exposed laminate; and d) developing the granulated laminate.

In the lithography method (I or II) according to the present invention, the step a) is to form a laminate by alternately stacking photosensitive resin layers and metal layers on the target substrate for lithography. Here, the laminate of the step a) may correspond to the meta-photoresist (II) shown based on FIGS. 3 and 4.

Figure 5:
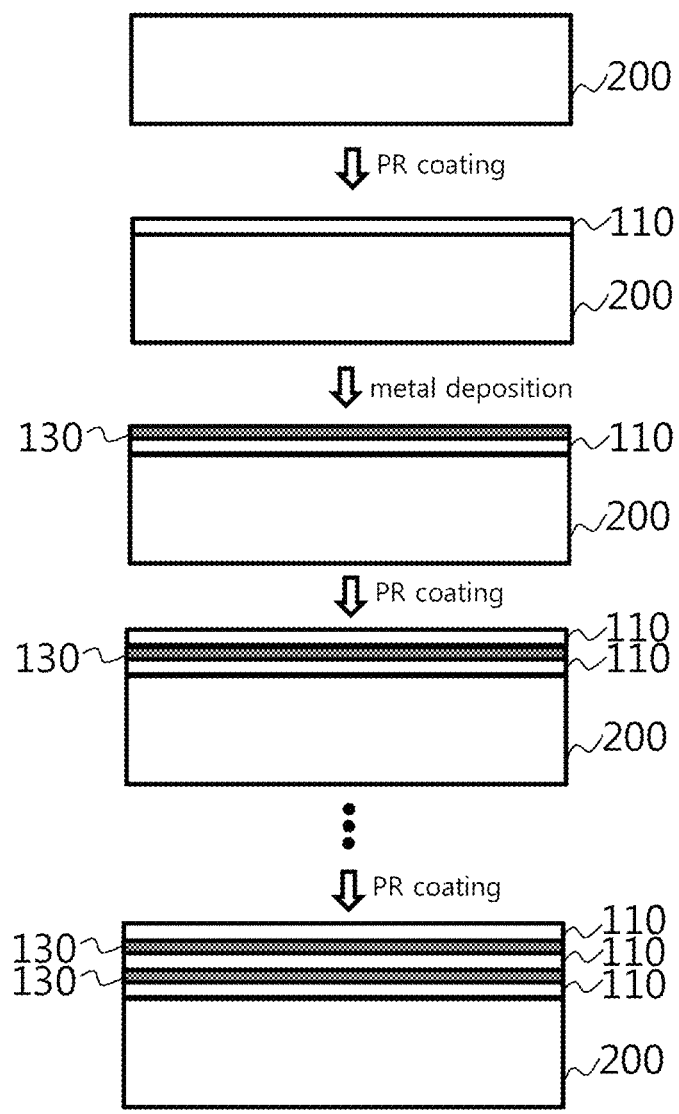
FIG. 5 is one process diagram showing a process of forming a laminate of step a) in a lithography method according to an exemplary embodiment of the present invention.

FIG. 5 is one process diagram showing the process of step a) in the lithography method (I or II) according to an exemplary embodiment of the present invention. As one example shown in FIG. 5($a$), the laminate may be formed by forming the photosensitive resin layer 110 on the target substrate 200 for lithography so as to contact the surface of the substrate 200, alternately stacking the metal layers 130 and the photosensitive resin layers 110, and disposing the photosensitive resin layer 110 on the uppermost part, and as one example shown in FIG. 5($b$), the laminate may be formed by forming the metal layer 130 on the target substrate 200 for lithography so as to contact the surface of the substrate 200, alternately stacking the metal layers 130 and the photosensitive resin layers 110, and disposing the photosensitive resin layer 110 on the uppermost part.

The photosensitive resin layer 110 may be formed by coating a photosensitive resin solution which is a liquid in which the photosensitive resin is dissolved into the solvent. The coating of the photosensitive resin solution may be performed by any method used in applying the photosensitive resin in the general photo lithography, and as a non-limiting example thereof, a spin coating method, and the like, may be included. Here, the present invention is not limited by the forming method of the photosensitive resin layer 110. After the photosensitive resin solution is applied, drying the applied resin layer (soft baking) may be performed, and selectively, a hard baking may be performed.

The metal layer 130 may be performed by deposition processes generally used in the semiconductor process, and as a non-limiting example thereof, chemical vapor deposition (CVD), physical vapor deposition (PVD), plasma enhanced chemical vapor deposition (PECVD), and the like, may be included, but the present invention is not limited to the forming method of the metal layer 130. The metal layer 130 may be formed by a general printing method including coating metal ink containing metal particles or metal complexes, and by applying a slurry containing metal particles.

The metal of the metal layer may be silver, gold, aluminum, copper, or alloys thereof. The metal may allow the metal layer to be granulated at a significantly low heat-treatment temperature, in the step b) or in the step c2).

The metal layers may be independently formed so as to have a thickness of 5 to 50 nm. When the metal layer has a thickness less than 5 nm, which is extremely thin, an effect for prevention of light diffraction is not significant, such that there is a risk that mask patterns having a structure with diffraction limit or less may not be transferred on a substrate, and when the metal particle has a thickness more than 50 nm, which is extremely large, it is difficult to propagate light, and there is a risk that the granulating the metal layers by the heat-treatment may not be uniformly and easily performed.

That is, since the metal layers and the photosensitive resin layers are alternately formed, as shown in FIG. 5, the metal layer may contact the surface of the substrate and/or may be disposed between the photosensitive resin layers and/or may be disposed on the uppermost part, wherein the metal layers may be formed so that the number of metal layers included in the laminate is N (a natural number satisfying $2 \leq N \leq 8$). Here, when the metal layer contacts a surface of the substrate, and the photosensitive resin layer is disposed on the uppermost part, the photosensitive resin layers of the total number being N and the metal layers may be alternately stacked and when the photosensitive resin layer contacts a surface of the substrate, and the photosensitive resin layer is disposed on the uppermost part, the photosensitive resin layers of the total number being N+1 and the metal layers may be alternately stacked. When the metal layer contacts a surface of the substrate, and the metal layer is disposed on the uppermost part, the photosensitive resin layers of the total number being N−1 and the metal layers may be alternately stacked and when the photosensitive resin layer contacts a surface of the substrate, and the metal layer is disposed on the uppermost part, the photosensitive resin layers of the total number being N and the metal layers may be alternately stacked.

The thickness of the photosensitive resin layer may affect an interval spaced between the metal layers adjacent to each other and/or a distance between the metal layers adjacent to the uppermost surface and the lowermost surface of the laminate. The thickness of the photosensitive resin layer may be each independently 5 to 100 nm, and when the thickness of photosensitive resin layer is less than 5 nm, an increase in an effect for prevention of light diffraction is not significant; meanwhile, fraction occupied by the photosensitive resin layer in the laminate is extremely decreased, such that it is difficult to implement a precise and fine structure. When the thickness of the photosensitive resin layer is more than 100 nm, an effect for prevention of light diffraction by the metal layer may be deteriorated.

The lithography method (I) according to an exemplary embodiment of the present invention may include b1) fabricating the meta-photoresist (I) by granulating the metal layer as metal particles arranged so as to be spaced apart from each other, by applying energy to the laminate, after forming of the laminate.

Energy to be applied to the laminate in order to granulate the metal layer as the metal particles arranged so as to be spaced apart from each other may be at least one selected from heat energy, vibration energy, and light energy. When energy is applied to a thin metal layer, the metal layer (metal thin film) may be granulated as a plurality of particles by minimized driving power of surface (interface) energy.

In detail, heat energy may include Joule energy. Heat energy may be applied by a direct method in which heat source directly contacts the laminate or an indirect method in which heat is indirectly applied by heat transfer media such as air without physical contact between heat source and the laminate, and the granulating of the metal layer may be performed by heat energy to be applied to the laminate.

In detail, light energy may include infrared ray to near-infrared ray, and the applying of the light energy may include irradiation of light. As a non-limiting example thereof, the granulating may be performed by disposing infrared ray or near-infrared ray light source so as to be spaced apart from the laminate by a predetermined distance and irradiating the laminate by light.

In detail, vibration energy may include microwave and/or ultrasonic wave, and the applying of vibration energy may include irradiation of microwave and/or ultrasonic wave. As a non-limiting example thereof, the granulating may be performed by disposing microwave and/or ultrasonic wave generating source so as to be spaced apart from the laminate and irradiating microwave and/or ultrasonic wave to the laminate.

In addition, the granulating may be performed by continuously or sequentially applying the above-described different kinds of energy to the laminate.

The granulating by heat energy among the above-described energy may be more substantial, which is because even though the laminate which is a treated subject has a large area, energy may be uniformly and homogeneously applied, and the granulating may be performed in a short time.

Figure 6:
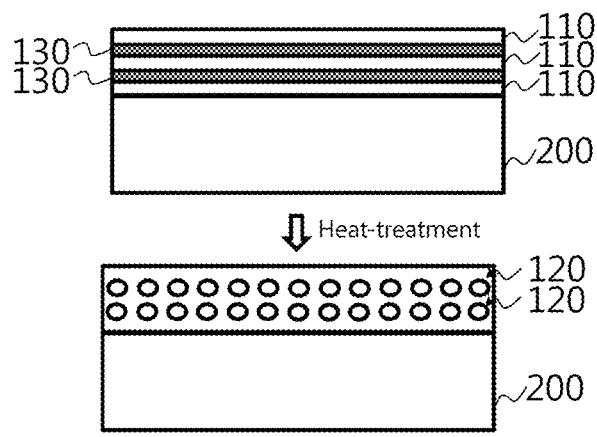
FIG. 6 is one process diagram showing a granulation process of step b1) in a lithography method according to an exemplary embodiment of the present invention.

FIG. 6 is one process diagram showing the granulating (b1) by heat energy, and as shown in FIG. 6, the metal layer of the laminate may be granulated as the metal particle layer consisting of metal particles spaced apart from each other on the same surface by the heat-treatment, and even though a laminate has a large area, the granulating may be uniformly and homogenously performed in a short time.

In order to minimize the effect on the photosensitive resin or the substrate by the heat-treatment, it is preferred to perform heat-treatment at a low temperature similar to a hard baking temperature or close to the hard baking temperature of the general photosensitive resin. The metal layer consisting of silver, gold, aluminum, copper, or alloys thereof, and having a thickness of 5 to 50 nm may allow the granulating to be performed under a relatively low energy. In detail, heat-treatment for the granulating may be performed at a temperature of 100 to 300, for 1 minute to 1 hour in the air.

Here, after the photosensitive resin is applied, and soft baking and hard baking are performed in the step a), the applying of the energy of the step b1) may be performed, or the hard baking is not performed in the step a), the hard baking may be simultaneously performed at the time of applying energy of the step b1). In particular, when the applied energy is heat energy, the hard baking may be continuously performed by heat energy to be applied for granulation.

In addition, in a modified example of the lithography method (I) according to an exemplary embodiment of the present invention, the forming of the laminate of the step a) and the applying of energy of the step b1) may be continuously performed. In detail, when the metal layers and the photosensitive resin layers are alternately formed, right after the metal layers are formed, energy for granulating the formed metal layers may be applied and the photosensitive resin layer may be formed on the metal particle layer formed by the granulating. That is, when the metal layers of which the total number being N(a natural number satisfying 2≤N≤8) and the photosensitive resin layers are alternately stacked to form a laminate, energy for granulating may be applied for each metal layer right after each metal layer is formed, such that energy may be applied by the total of N times.

In the lithography method (I) according to an exemplary embodiment of the present invention, the metal layer is granulated to form the meta-photoresist (I), and then c1) exposing the meta-photoresist (I) by a mask, and developing the exposed meta-photoresist (I) may be performed.

Figure 7:
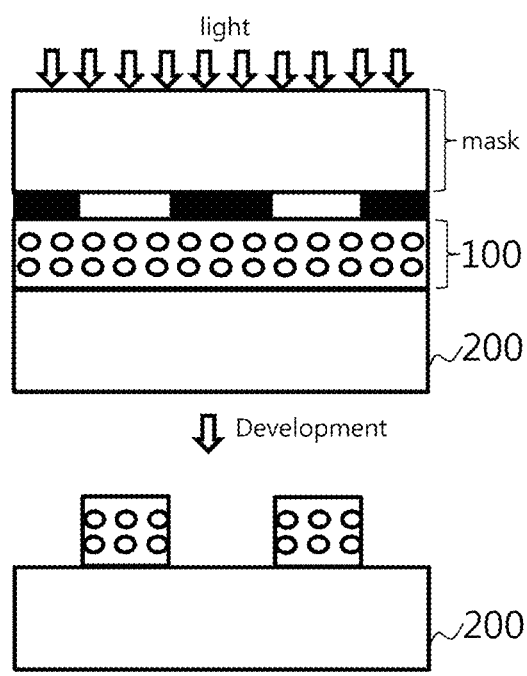
FIG. 7 is one process diagram showing exposure and development processes using a meta-photoresist of step c1) in a lithography method according to an exemplary embodiment of the present invention.

FIG. 7 is one process diagram showing exposure and development processes using the meta-photoresist (I), FIG. 7(a) shows an exposure process, and FIG. 7(b) shows a development process.

The mask used for exposure may be a mask used in general lithography process having desired patterns. However, due to an effect for prevention of diffraction by the meta-photoresist (I), the mask may be formed by mask patterns having a size (pitch) with half-wave or less of light used for exposure. Light used for exposure may be a light in extreme ultraviolet to ultraviolet region, and specifically, may be a light having a wavelength of 100 nm to 400 nm, and more specifically, may be a light having a wavelength of 300 nm to 400 nm. As a specific and non-limiting example, the mask may be a chromium mask with patterns having half-wave or less of light used for exposure, and as described above, the mask may be formed by the photosensitive resin layer formed on a surface opposite to the meta-photoresist according to the present invention.

Due to the granulating of the step b1), the development process may be performed by a development process generally used in a semiconductor lithography process. The reason is that as the metal layer are granulated, the solvent may be smoothly permeated in a thickness direction of the meta-photoresist (I), such that the photosensitive resin region having changed chemical properties (properties on solvent) changed by light may be removed regardless of the metal particles.

In the lithography method (II) according to an exemplary embodiment of the present invention, as being independent of the above-described lithography method (I), after the step a) is performed, exposing the laminate by the mask of the step b2) may be performed without applying energy for granulating the metal layer. Similar to the description above based on FIG. 7(a), the mask for exposure may be a mask used in general lithography process having desired patterns. However, due to an effect for prevention of diffraction by the meta-photoresist (III), the mask may be formed with mask patterns having a size (pitch) with half-wave or less of light used for exposure. Light used for exposure may be a light in extreme ultraviolet to ultraviolet region, and specifically, may be a light having a wavelength of 100 nm to 400 nm, and more specifically, may be a light having a wavelength of 300 nm to 400 nm. As a specific and non-limiting example, the mask may be a chromium mask with patterns having half-wave or less of light used for exposure, and as described above, the mask may be formed by the photosensitive resin layer formed on a surface opposite to the meta-photoresist according to the present invention.

The lithography method (II) according to an exemplary embodiment of the present invention may include c2) granulating the metal layer as a layer of metal particles arranged so as to be spaced apart from each other, by applying energy to the exposed laminate, after performing the exposing. Similar to the description above in the lithography method (I), energy to be applied to the exposed laminate may be at least one selected from heat energy, vibration energy, and light energy, and different kinds of energy may be continuously or sequentially applied to the laminate.

As described above, as energy to be applied for the granulating, heat energy may be more substantial, and when the granulating may be performed by heat energy, even though the laminate which is a treated subject has a large area, energy may be uniformly and homogeneously applied, and the granulating may be performed in a short time.

Similar to the description above based on FIG. 6, heat-treatment for the granulating may be performed at a temperature of 100 to 300, for 1 minute to 1 hour in the air.

The lithography method (II) according to an exemplary embodiment of the present invention may include d) developing the laminate including granulated metal layers, after the exposing and granulating are sequentially performed. Similar to the description above based on FIG. 7(*b*), the development process may be performed by a development process generally used in a semiconductor lithography process.

The lithography method (III) according to an exemplary embodiment of the present invention may include fabricating the meta-photoresist by alternately stacking the photosensitive resin layers and the metal particle layers on the target substrate so that the photosensitive resin layer or the metal particle layer is disposed on a lowermost surface which is a surface contacting the target substrate for lithography, and as being independent of the photosensitive resin layer or the metal particle layer disposed on the lowermost surface, the photosensitive resin layer or the metal particle layer is disposed on an uppermost surface which is an opposite surface to the lowermost, the metal particle layer being formed by an inclination angle deposition; and exposing the meta-photoresist by a mask, and developing the exposed meta-photoresist. Since the exposure and development processes are similar to those as described above, the detailed description thereof will be omitted.

Figure 8:
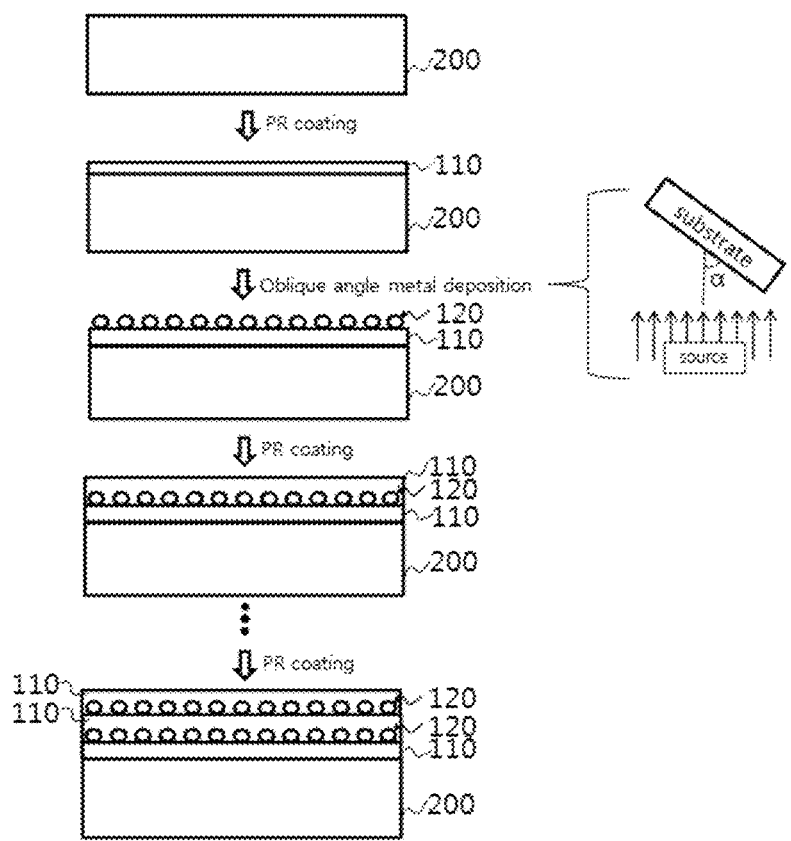
FIG. 8 is one process diagram showing a method of fabricating the meta-photoresist in a lithography method according to an exemplary embodiment of the present invention.

FIG. 8 is one example showing the fabricating of the meta-photoresist on the target substrate in the lithography method (III) according to an exemplary embodiment of the present invention in detail. As one example shown in FIG. 8, metals may be directly deposited on the photosensitive resin layer (or on the target substrate) as a particle phase, by oblique angle deposition (OAD) (which is referred to as an oblique angle incident deposition). Here, deposition source for metal deposition and a surface of the target substrate (a surface to be deposited) are not vertically opposite to each other, that is, deposition beam generated from the deposition source is not incident in a vertical manner on a surface of the target substrate, but the deposition beam is incident at a predetermined oblique angle on a surface of the target substrate, such that the metal may be deposited as a particle phase rather than a continuous thin film. An angle ($\alpha$ of FIG. 8) at which the deposition beam is incident on the surface of the target substrate may be 30° or less, and more specifically, 1° to 30°. Here, the deposition beam may be a beam formed by physical sputtering using a metal deposition source, but the present invention is not limited thereto. The metal particle formed by OAD may have an average diameter of 5 to 150 nm, specifically, 5 to 100 nm, more specifically, 5 to 50 nm, and even more specifically, 5 to 10 nm. The average size of metal particles in the metal particle layer may be adjusted by controlling deposition conditions such as a supply amount of the deposition beam, rotation velocity of the target substrate, an angle between the deposition beam and the surface of the target substrate, and the like, at the time of OAD.

A lithography method (IV) according to an exemplary embodiment of the present invention may include fabricating a meta-photoresist by applying a photosensitive resin solution containing metal particles dispersed thereinto onto a target substrate for lithography and drying it; exposing the meta-photoresist by a mask; and developing the exposed metal-photoresist.

Here, the meta-photoresist fabricated by applying the photosensitive resin solution onto the substrate and drying it may correspond to the above-described meta-photoresist (III).

The photosensitive resin solution may contain a photosensitive resin, metal particles, and a solvent dissolving the photosensitive resin. The photosensitive resin may be any polymer material of which resistance to solvent is changed by light used in general lithography process, and may include a negative type photosensitive resin which is non-soluble in solvent by being exposed to light or a positive type photosensitive resin which is soluble in solvent by being exposed to light. The metal particle may be any metal as long as a metal has excellent dispersibility in a liquid having the photosensitive resin dissolved thereinto. As a specific example, the metal particle may be an alkali metal, an alkaline earth metal, a transition metal, a post-transition metal, a metalloid, or alloys thereof.

In order to decrease roughness of a developed cross-section, uniformly propagate light in the meta-photoresist (III), and effectively prevent diffraction of light, the metal particle may have an average diameter of 5 to 150 nm, specifically, 5 to 100 nm, more specifically, 5 to 50 nm, and even more specifically, 5 to 10 nm.

The meta-photoresist resin solution may contain the metal particles in 20 to 200 parts by weight, based on 100 parts by weight of the photosensitive resin. When the photosensitive solution contains metal particles less than 20 parts by weight based on 100 parts by weight of the photosensitive resin, an effect for prevention of light diffraction by the metal particles may not be significant, and when the metal particles more than 200 parts by weight based on 100 parts by weight of the photosensitive resin, an increase in an effect for prevention of light diffraction is not significant; meanwhile, there is a risk that light may not be smoothly delivered in the meta-photoresist (III), exposure may not be uniformly and homogeneously performed in a thickness direction of the meta-photoresist, and at the time of development of the exposed meta-photoresist (III), the developed cross-section has deteriorated quality due to the metal particles.

The applying of the photosensitive resin solution may be performed by any method used in applying the photosensitive resin in the general photo lithography, and as a non-limiting example thereof, a spin coating method, and the like, may be included. After the photosensitive resin solution is applied, drying the applied resin layer (soft baking) may be performed, and selectively, a hard baking may be performed.

The meta-photoresist (III) fabricated on the substrate by applying the photosensitive resin solution and drying it may have a thickness of 10 nm to 500 nm, specifically, 15 to 300 nm, and more specifically, 25 to 200 nm, so that a mask role may be effectively performed without deterioration of the quality of the subsequent process, and development patterns on which patterns formed in the mask are precisely transferred, and developed cross-section having a flat surface shape and high quality may be fabricated.

The mask used for exposure may be a mask used in general lithography process having desired patterns. However, due to an effect for prevention of diffraction by the meta-photoresist (III), the mask may be formed with mask patterns having a size (pitch) with half-wave or less of light used for exposure. Light used for exposure may be a light in extreme ultraviolet to ultraviolet region, and specifically, may be a light having a wavelength of 100 nm to 400 nm, and more specifically, may be a light having a wavelength of 300 nm to 400 nm. As a specific and non-limiting example, the mask may be a chromium mask with patterns having half-wave or less of light used for exposure.

The development process may be performed by a development process generally used in a semiconductor lithography process. The reason is that since the meta-photoresist (III) fabricated by applying the photosensitive resin solution has a structure in which metal particles are dispersed into the photosensitive resin, a solvent (solvent for dissolving a part of the photosensitive resin of which chemical properties are changed by exposure to be removed) may be smoothly permeated in a thickness direction, such that the photosensitive resin region having physical properties (properties on solvent) changed by light may be removed regardless of the metal particles.

In the lithography method (I, II, III or IV) according to an exemplary embodiment of the present invention, after the above-described exposure and development are performed, subsequent processes such as injection of impurities into the target substrate, etching of the target substrate, and deposition of a material on the target substrate may be performed, and after the subsequent processes are performed, physically or chemically removing the meta-photoresist remained (remained by the development) on the target substrate may be further performed. The removing of the remained meta-photoresist may be performed by materials and methods generally used for removing the photoresist developed in the semiconductor lithography process.

Figure 9:
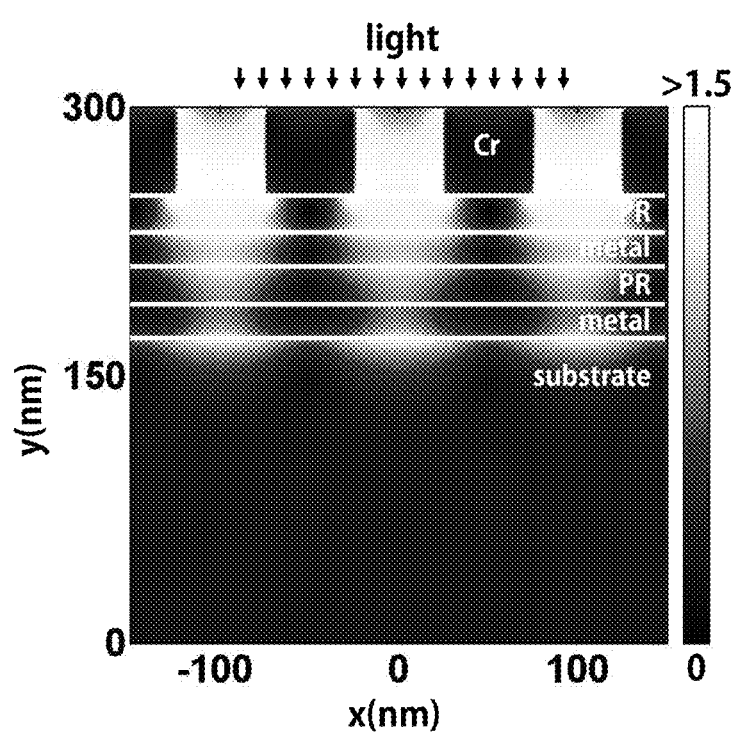
FIG. 9 shows a result obtained by sequentially stacking a metal layer—a photosensitive resin layer—an Ag metal layer—a photosensitive resin layer on a substrate, performing a light exposure with a chromium mask on which patterns of 50 nm are formed, and observing the progress of the light.

FIG. 9 shows a result obtained by observing progress of light in the laminate when sequentially stacking Ag metal layer (thickness of 20 nm)-photosensitive resin layer (thickness of 20 nm)-Ag metal layer (thickness of 20 nm)-photosensitive resin layer (thickness of 20 nm), and exposing the laminate with light of 365 nm by a chromium mask having patterns of 50 nm formed thereon, and color scale of 0 to >1.5 at the right side of FIG. 9 indicates standardized electric field intensity (|Eo|/|Ei|).

It may be appreciated from FIG. 9 that light progresses in the laminate while maintaining full width half maximum (FWHM) of 50 nm even though the mask pattern has a diffraction limit or less.

With the meta-photoresist according to the present invention, mask patterns having a diffraction limit or less may be precisely transferred, and equipments and methods used in the existing previously established lithography process may be used without a significant change, thereby being commercially utilized.

Although the exemplary embodiments and drawings defined by specific matters of the present invention have been disclosed for illustrative purposes, the present invention is not limited thereto, and those skilled in the art will appreciate that various modifications, additions and substitutions are possible.

Accordingly, the scope of the present invention is not construed as being limited to the described embodiments but the appended claims as well as equivalent thereof will fall within the scope of the present invention.

What is claimed is:

1. A photoresist composite layer for photo lithography wherein patterns of a photo mask are transferred by exposure and development, comprising:
   a photoresist layer; and
   metal particles that are impregnated into the photoresist layer and are arranged to be spaced apart from each other on a plane.

2. The photoresist composite layer for photo lithography of claim 1, wherein the composite layer has a thickness of 10 nm to 500 nm.

3. The photoresist composite layer for photo lithography of claim 1, wherein the metal particle has an average diameter of 5 to 150 nm.

4. The photoresist composite layer for photo lithography of claim 1, wherein the composite layer includes a plurality of metal particle layers, wherein, for each layer, metal particles are impregnated into the photoresist layer and are arranged to be spaced apart from each other on a plane, the number of metal particle layers being N(2<N<8).

5. A photoresist laminate for photo lithography, wherein patterns of a photo mask are transferred by exposure and development, and the laminate is a laminate in which photoresist layers and metal layers are alternately stacked.

6. The photoresist laminate for photo lithography of claim 5, wherein at least one of the metal layers of the laminate has a thickness of 5 to 50 nm.

7. The photoresist laminate for photo lithography of claim 5, wherein at least one of the photoresist layers of the laminate has a thickness of 5 to 100 nm.

8. The photoresist laminate for photo lithography of claim 5, wherein the photoresist laminate includes a number of metal layers being N (2<N<8), and the photoresist layer or the metal layer is disposed on a lowermost surface, and as being independent of the photoresist layer or the metal layer disposed on the lowermost surface, the photoresist layer or the metal layer is disposed on an uppermost surface, the lowermost surface being a surface contacting a substrate, and the uppermost surface being an opposite surface to the lowermost surface.

9. A photoresist composite layer for photo lithography, comprising: a photoresist layer; and metal particles dispersed and impregnated into the photoresist layer or dispersed onto a surface of the photoresist layer, wherein patterns of a photo mask are transferred by exposure and development.

10. The photoresist composite layer for photo lithography of claim 9, wherein the composite layer contains the metal particles in 20 to 200 parts by weight, based on 100 parts by weight of a photosensitive resin used in the photoresist layer.

11. The photoresist composite layer for photo lithography of claim 9, wherein the metal particle has an average diameter of 5 to 150 nm.

12. The photoresist composite layer for photo lithography of claim 1, wherein the metal particles are silver, gold, aluminum, copper, or alloys thereof.

* * * * *